(12) United States Patent
Machida et al.

(10) Patent No.: US 8,106,395 B2
(45) Date of Patent: Jan. 31, 2012

(54) SEMICONDUCTOR DEVICE AND METHOD OF MANUFACTURING THE SAME

(75) Inventors: Shuntaro Machida, Kokubunji (JP); Takashi Kobayashi, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 581 days.

(21) Appl. No.: 12/113,923

(22) Filed: May 1, 2008

(65) Prior Publication Data

US 2008/0277661 A1 Nov. 13, 2008

(30) Foreign Application Priority Data

May 11, 2007 (JP) ................................ 2007-127161

(51) Int. Cl.
*H01L 21/66* (2006.01)
*H01L 23/58* (2006.01)
(52) U.S. Cl. ... 257/48; 257/773; 257/786; 257/E29.111; 257/E21.531; 438/18
(58) Field of Classification Search .................... 257/48, 257/E29.111, E21.531; 438/18
See application file for complete search history.

(56) References Cited

U.S. PATENT DOCUMENTS

| | | | | |
|---|---|---|---|---|
| 5,319,224 A | * | 6/1994 | Sakashita et al. | 257/203 |
| 5,962,854 A | * | 10/1999 | Endo | 250/349 |
| 6,060,336 A | * | 5/2000 | Wan | 438/50 |
| 6,063,640 A | | 5/2000 | Mizukoshi et al. | |
| 6,127,729 A | * | 10/2000 | Fukuda | 257/736 |
| 6,603,182 B1 | * | 8/2003 | Low et al. | 257/432 |
| 2002/0117729 A1 | * | 8/2002 | Aiki et al. | 257/459 |
| 2003/0151047 A1 | * | 8/2003 | Corbett et al. | 257/48 |
| 2005/0151248 A1 | | 7/2005 | Shau | |
| 2005/0204223 A1 | * | 9/2005 | Ong | 714/724 |
| 2005/0208684 A1 | * | 9/2005 | Yamada et al. | 438/14 |
| 2006/0097285 A1 | | 5/2006 | Nishizawa | |
| 2007/0090902 A1 | | 4/2007 | Deligianni et al. | |
| 2008/0093740 A1 | * | 4/2008 | Sakai et al. | 257/737 |

FOREIGN PATENT DOCUMENTS

| | | |
|---|---|---|
| JP | 07-176577 A | 7/1995 |
| JP | 08-064648 A | 3/1996 |
| JP | 2002-303653 A | 10/2002 |

* cited by examiner

*Primary Examiner* — Eugene Lee
*Assistant Examiner* — Peniel M Gumedzoe
(74) *Attorney, Agent, or Firm* — Miles & Stockbridge P.C.

(57) ABSTRACT

A technique of manufacturing a semiconductor device capable of performing a probe test by a common test apparatus as normal LSI chips even for large-area chips is provided. A chip comprising a device formed on a device area by a semiconductor process and including a plurality of test areas sectioned by chip areas is prepared. Next, pads to be electrically connected to the device are formed at corresponding positions on the respective plurality of test areas. Subsequently, the respective test areas are tested by a same probe card via the plurality of pads.

10 Claims, 12 Drawing Sheets

SEMICONDUCTOR DEVICE AND METHOD OF MANUFACTURING THE SAME

CROSS-REFERENCE TO RELATED APPLICATION

The present application claims priority from Japanese Patent Application No. JP 2007-127161 filed on May 11, 2007, the content of which is hereby incorporated by reference into this application.

TECHNICAL FIELD OF THE INVENTION

The present invention relates to a technique for a semiconductor device and a method of manufacturing the semiconductor device. More particularly, the present invention relates to a technique effectively applied to a probe test of Micro Electro Mechanical Systems (MEMS) fabricated by a semiconductor process.

BACKGROUND OF THE INVENTION

According to the MEMS technology in recent years, devices in which a sensor, an actuator and the like manufactured by the LSI manufacturing process (semiconductor process) are included have got to be developed.

The size of a chip mounting these devices is various depending on the size of the sensor and actuator to be mounted, and the chip may have a larger area than the normal chip size that is about 1 to 2-cm square or smaller.

In the case of normal LSI chips, probe tests are performed on all of the devices in a wafer state by using a probe card and a test apparatus such as a prober and a tester to discriminate defected chips in the wafer stage in the process prior to a device yield analysis and a subsequent mounting process such as wafer dicing step and packaging step.

Probe test is performed by putting needles on all of pads to which power and signals from the external are supplied by using a probe card to detect defects in electrical characteristics of the devices on the chip, and further detects defects in the pad itself.

To perform a probe test, a probe card having a needle arrangement same as a pad arrangement of respective chips, a mother board for attaching the probe card to a prober and tester, and a holder for holding the probe card and the mother board are required.

In the case where the chip has the size of normal LSI chips, the mother board and holder are common and shared to use, and the probe test can be performed when preparing probe cards corresponding to respective chips. In other words, when performing probe tests on chips of a plurality of product classes by a prober and a tester, change of the test apparatus is done only by exchanging the probe cards. And thus, probe tests can be performed by measuring programs corresponding to respective kinds of chips, thereby preventing lowering of throughput in test.

For example, Japanese Patent Application Laid-Open Publication No. 2002-303653 (Patent Document 1) discloses a technique of an arrangement where the pads to be used in a probe test are collected on two sides of the four sides of outer circumference of a chip, thereby easing the needle-putting of the probe card and enabling tests on a neighboring plurality of chips at the same time.

And, Japanese Patent Application Laid-Open Publication No. H8-64648 (Patent Document 2) discloses a technique of providing a probe test pad to be shared by a neighboring plurality of chips and using a decoder circuit to select chips to be tested, thereby enabling tests on the plurality of chips by one time of needle-putting.

Moreover, Japanese Patent Application Laid-Open Publication No. H7-176577 (Patent Document 3) discloses a technique of sectioning one chip into a plurality of areas and performing probe tests on respective areas at the same time, thereby shortening test time.

SUMMARY OF THE INVENTION

Meanwhile, chips which mount a sensor and actuator fabricated by MEMS technology are also required to be tested as the normal LSI chips. When the chips are large-area chips, the probe card is required to be large-area, and thus the mother board and holder used in the normal LSI probe test cannot be used. Moreover, in the case where the test apparatuses such as a prober and tester are not compatible to the large-area chips, there arises a requirement to remodel the apparatus itself.

The sensor and actuator are often produced by a small amount and in multiple product classes, and so if the probe card holder is exchanged and changed every class, the test cost is added by the steps for the exchange/change. And moreover, in the case where the prober and tester are required to be remodeled, there arises a requirement to prepare an exclusive test apparatus per class and so forth, and thus a problem arises that the test cost is further increased.

Patent Documents 1 and 2 aim to shorten test time by performing probe tests on a plurality of chips at the same time, and Patent Document 3 aims to shorten test time as to normal LSI chips by sectioning a chip into a plurality of areas and performing probe tests on respective areas at the same time. This means that, the above Patent Documents are applied for LSIs having the normal chip size, and not applicable when the chip size is larger than the normal size.

An object of the present invention is to provide a manufacturing technique capable of performing probe tests on large-area chips by a test apparatus which can be shared with normal LSI chips.

The above and other objects and novel characteristics of the present invention will be apparent from the description of this specification and the accompanying drawings.

The typical ones of the inventions disclosed in this application will be briefly described as follows.

A semiconductor device according to the present invention comprises a semiconductor chip having a plurality of first pads and a plurality of second pads which are electrically connected to a device formed on a main surface of a semiconductor substrate, in which the main surface of the semiconductor chip is sectioned into a plurality of areas having a same size, and the plurality of first pads and the plurality of second pads are laid out at corresponding positions of the respective plurality of areas.

And, a method of manufacturing the semiconductor device according to the present invention comprises the following steps. Firstly, a step (a) of preparing a semiconductor wafer having a plurality of first areas and a plurality of second areas sectioned by the respective first areas, and having a device formed by a semiconductor process in the first area. Secondly, a step (b) of forming a plurality of first pads and a plurality of second pads, electrically connected to the device, at positions corresponding to the respective second areas. Thirdly, a step (c) of testing each of the plurality of second areas by a same probe card via the plurality of first pads and the plurality of second pads. Finally, a step (d) of dicing the semiconductor wafer and taking out a plurality of semiconductor chips from the plurality of first areas.

The effects obtained by typical aspects of the present invention will be briefly described below.

According to the present invention, a chip on a semiconductor wafer is sectioned into a plurality of areas to perform probe tests, and, a layout of pads to be used in the probe test is made such that each of the areas are same as the chip is moved in parallel or rotated, thereby enabling probe tests on a large-area chip by one probe card, improving throughput of test, and reducing test cost.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted. In addition, the description of the same or similar portions is not repeated in principle unless particularly required in the following embodiments. Also, in some drawings used in the embodiments, hatching may be used even in a plan view so as to make the drawings easy to see.

First Embodiment

Figure 1:
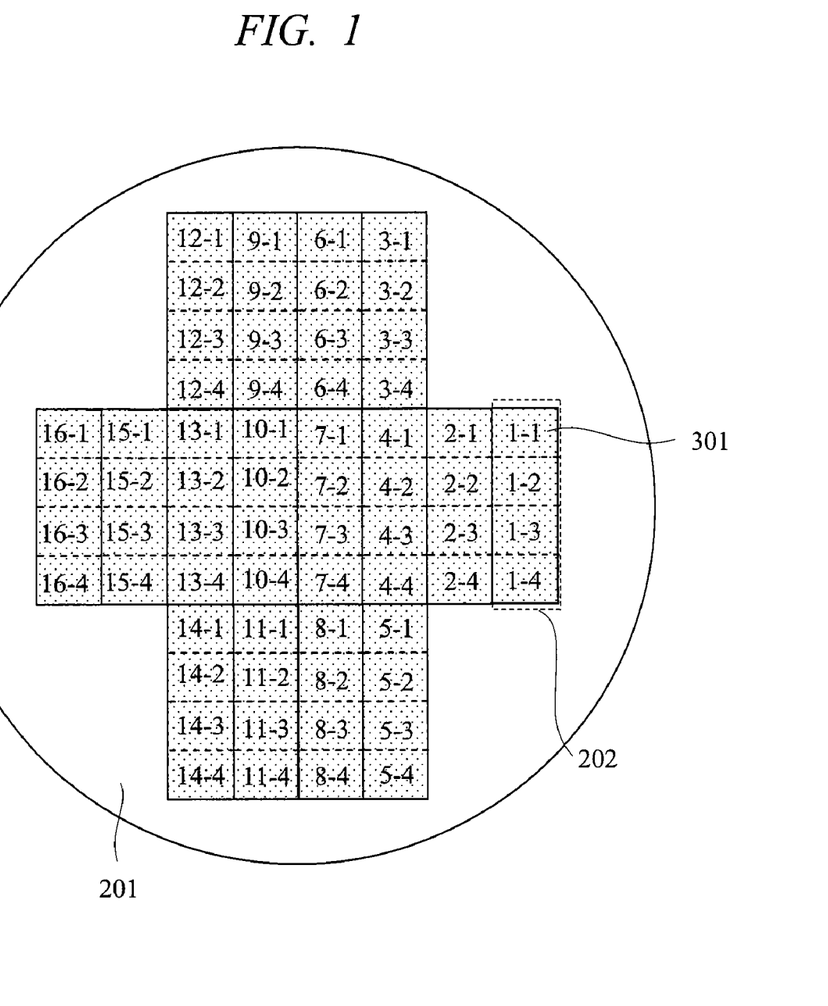
FIG. 1 is a plan view of a wafer schematically showing MEMS according to a first embodiment of the present invention.
Figure 6:
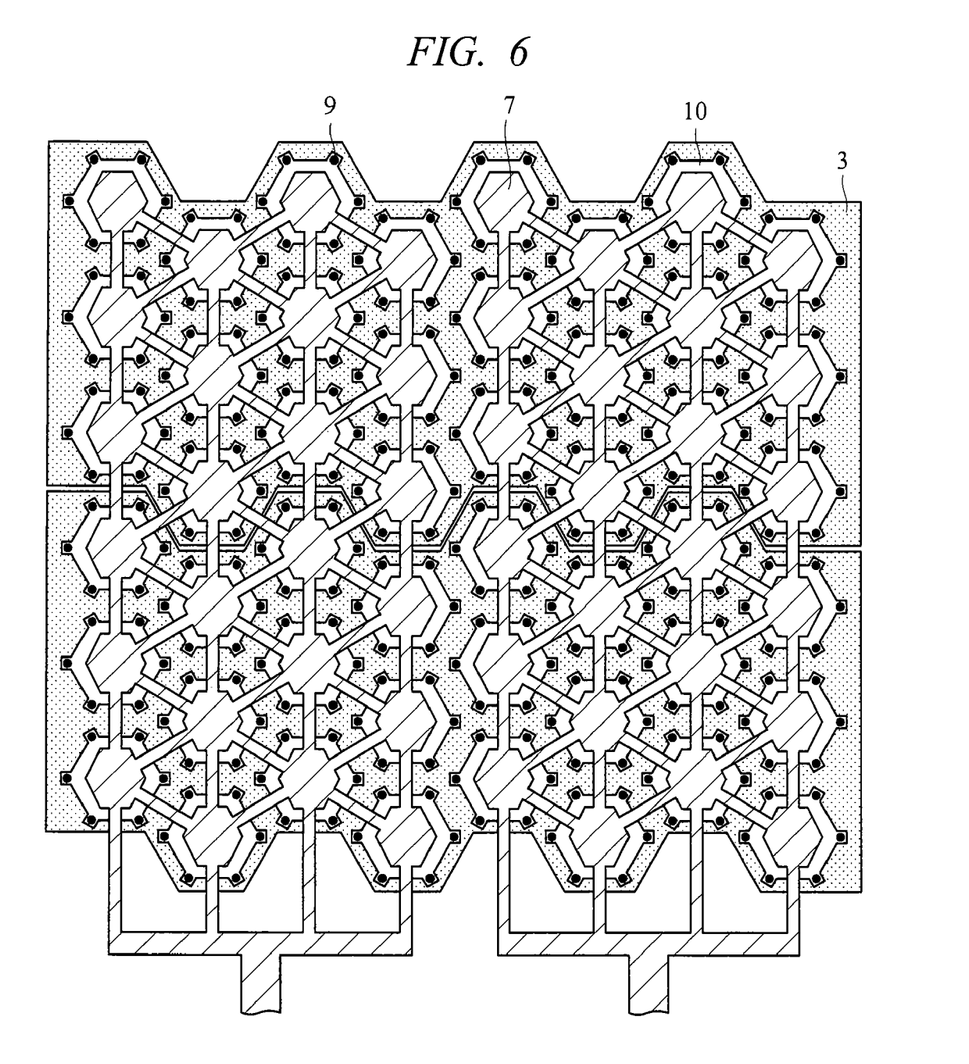
FIG. 6 is a plan view of main parts schematically showing the MEMS according to the first embodiment of the present invention.
Figure 7:
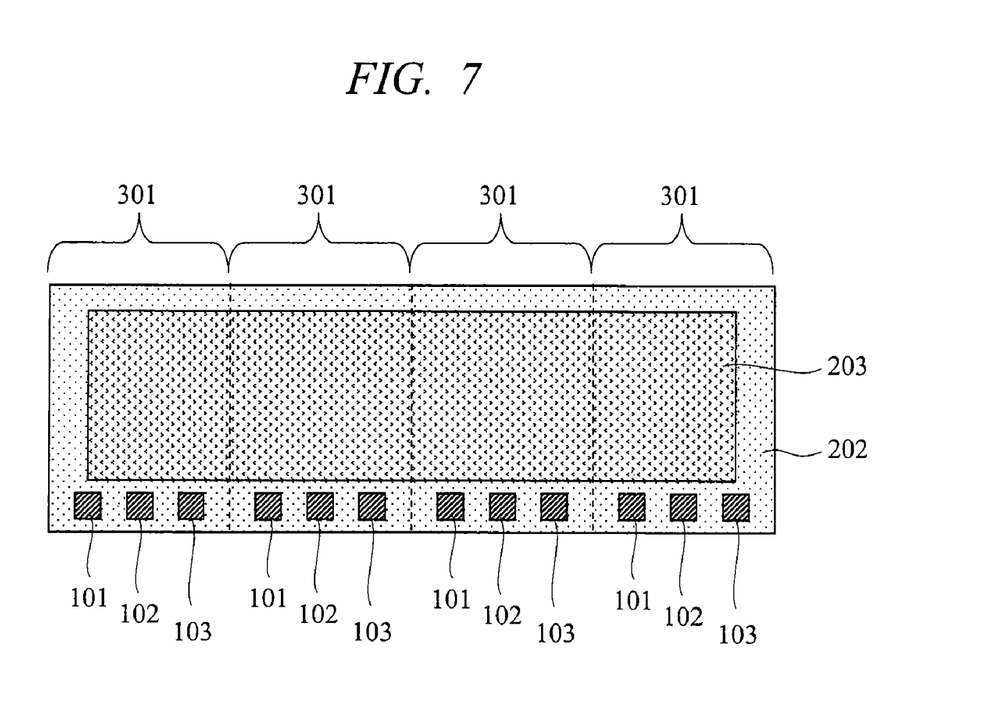
FIG. 7 is a plan view of a chip schematically showing the MEMS in a manufacturing step according to the first embodiment.

Plan views of MEMS according to a first embodiment of the present invention are shown in FIG. 1 and FIG. 7, and cross-sectional views thereof are shown in FIG. 2 to FIG. 5. And, an enlarged plan view of the MEMS according to the first embodiment is shown in FIG. 6.

A plan view of a wafer 201 of the MEMS according to the first embodiment of the present invention is schematically shown in FIG. 1. The wafer has a plurality of chip areas 202 (first area) and a plurality of test areas 301 (second area) sectioned by the respective chip areas 202. The chip area 202 is a unit area by which chips are to be cut out in a dicing step later, and sixteen areas are shown in FIG. 1. And, the test area 301 is a unit area to be tested in a test step later, and four areas are shown in the chip area 202.

Figure 2:
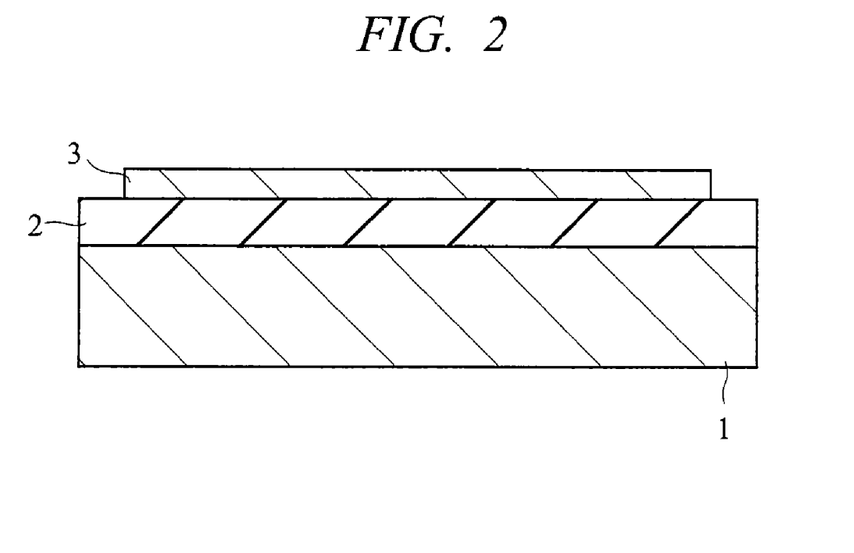
FIG. 2 is a cross-sectional view schematically showing the MEMS in a manufacturing step according to the first embodiment of the present invention.

FIG. 2, FIG. 3, FIG. 4, and FIG. 5 are cross-sectional views schematically showing the MEMS in manufacturing steps. As shown in FIG. 2, after sequentially forming an insulating film 2 and a conductive film 3 on a main surface (device formation surface) on a substrate 1, the conductive film 3 is patterned. The substrate 1 is, for example, a single crystal silicon substrate of p-type. And, the insulating film 2 is, for example, a silicon oxide film formed by CVD (Chemical Vapor Deposition). Further, the conductive film 3 is, for example, an aluminum film formed by sputtering. The patterning of the conductive film 3 is performed with the insulating film 2 as a stopper film by, for example, photolithography and etching. Note that, the patterned conductive film 3 serves as a lower electrode of a device configuring the MEMS.

Figure 3:
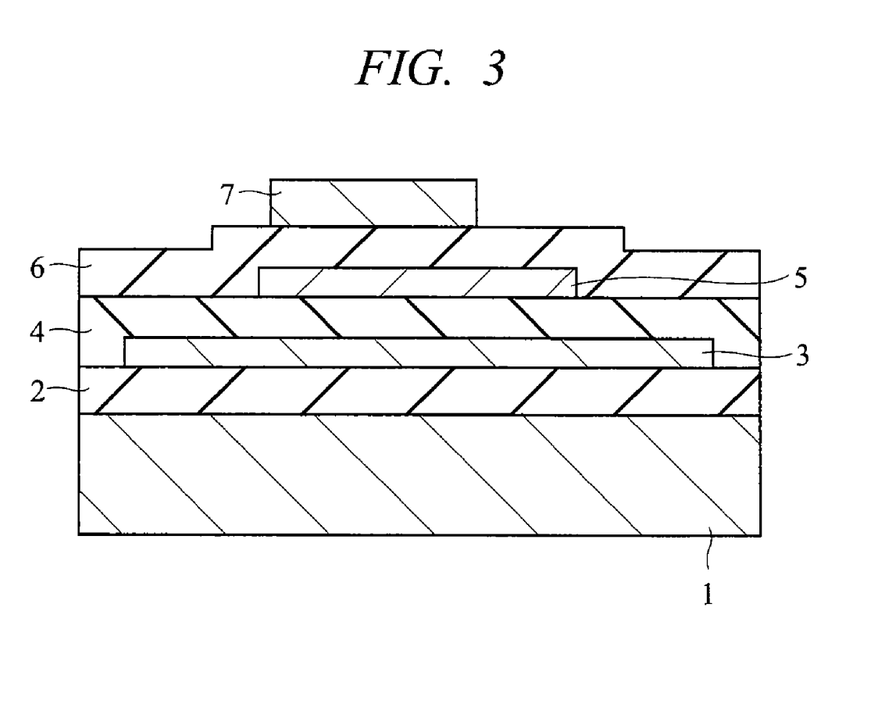
FIG. 3 is a cross-sectional view schematically showing the MEMS in a manufacturing step continued from FIG. 2.

Subsequently, as shown in FIG. 3, an insulating film 4 is formed on the insulating film 2 so as to cover the conductive film 3, and a sacrificial layer 5 which will be a hollow portion in a later step is formed. The insulating film 4 is, for example, a silicon oxide film formed by CVD using TEOS (Tetra-Ethyl-Ortho-Silicate). And, the sacrificial layer 5 is, for example, an amorphous silicon film. After that, an insulating film 6 is formed so as to cover the sacrificial layer 5, and a conductive film 7 is formed on the insulating film 6. The insulating film 6 is, for example, a silicon oxide film formed by CVD using TEOS, and the conductive film 7 is, for example, an aluminum film. The sacrificial layer 5 and the conductive film 7 are patterned by, for example, photolithography and etching. Note that, the patterned conductive film 7 serves as an upper electrode of the device configuring the MEMS.

Figure 4:
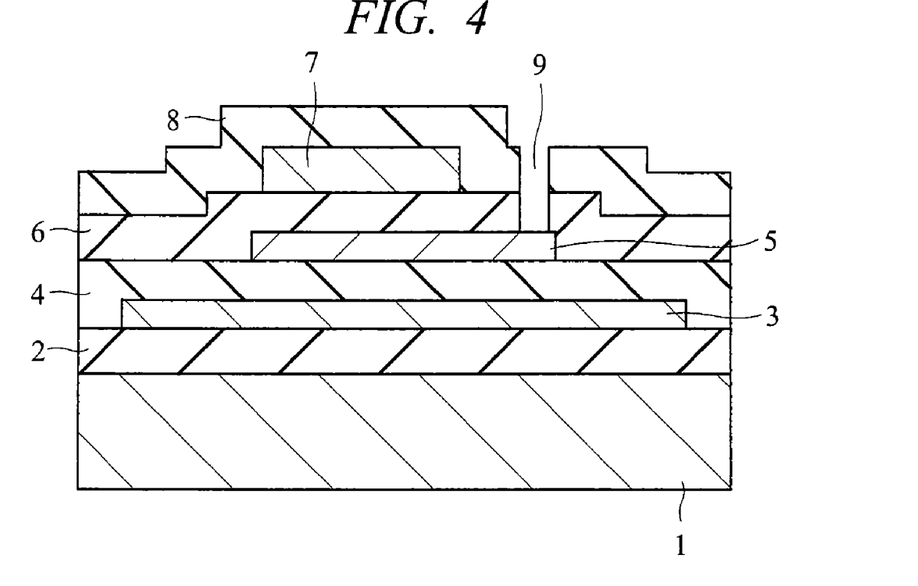
FIG. 4 is a cross-sectional view schematically showing the MEMS in a manufacturing step continued from FIG. 3.

Subsequently, as shown in FIG. 4, after an insulating film 8 is formed on the conductive film 7, the insulating films 6 and 8 are patterned. The patterning of the insulating films 6 and 8 are performed by, for example, photolithography and etching using the sacrificial layer 5 as a stopper film.

Figure 5:
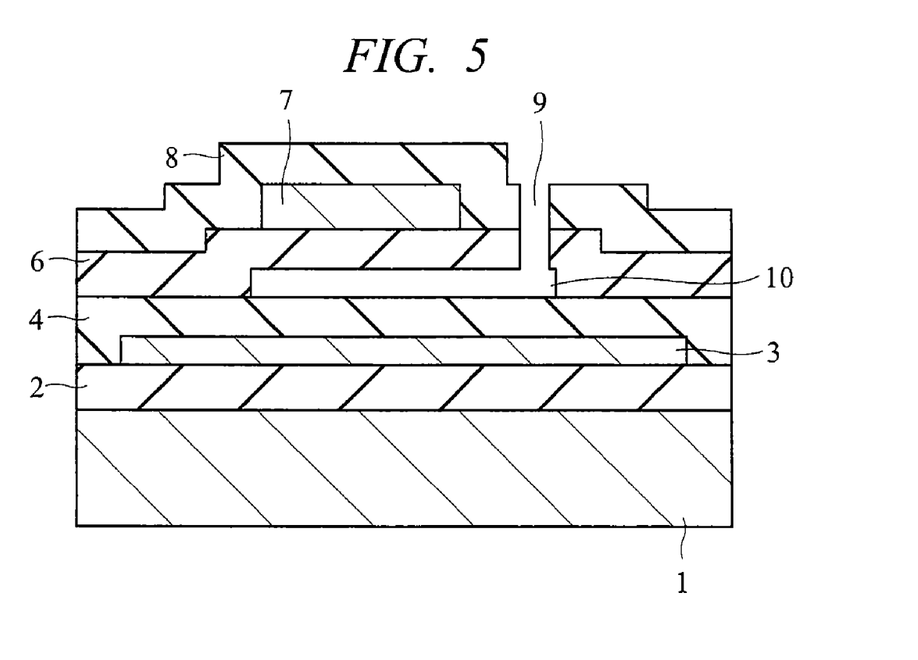
FIG. 5 is a cross-sectional view schematically showing the MEMS in a manufacturing step continued from FIG. 4.

Subsequently, as shown in FIG. 5, the sacrificial layer 5 is etched to form a hollow portion 10 between the insulating film 6 and the insulating film 4. The hollow portion 10 is formed by, for example, infiltrating KOH (potassium hydroxide) from a hole 9 of the insulating films 6 and 8 to etch the sacrificial layer 5 formed by an amorphous silicon film. In this manner, the MEMS device according to the first embodiment is achieved. The MEMS device performs, for example, an operation of a sensor which detects a change in pressure as a change in capacitance between the lower electrode 3 and the upper electrode 7.

Subsequently, the hole 9 is buried by an insulating film to close the hollow portion 10, and then, for example, a wiring electrically connected to the lower electrode 3 and the upper electrode 7 via a plug, and an interlayer insulating film for insulative isolation between wirings are formed. According to the foregoing steps, a wafer 201 comprising MEMS that is configured by a plurality of MEMS devices formed by a semiconductor process is prepared to the chip area 202 (cf. FIG. 1).

Subsequently, as shown in FIG. 7, a pad 101, a pad 102, and a pad 103 are formed at corresponding positions in the plurality of test areas 301 provided to one chip area 202, respectively. More specifically, a plurality of pads 101, a plurality of pads 102, and a plurality of pads 103 are laid out such that the test pads of the plurality of test areas 301 can be moved to same positions as each other when the chip is moved in a lengthwise direction of the chip area (moved in the horizontal direction of FIG. 7).

The pads 101, 102, 103 are, for example, aluminum films formed by sputtering. The pad 101 is electrically connected to the lower electrode 3 of the MEMS device via a wiring and so forth. The pad 102 is electrically connected to the upper electrode 7 via a wiring and so forth. And, the pad 103 is electrically connected to a wiring for power supply. In other words, the pads 101, 102, 103 are electrically connected to the plurality of MEMS devices formed in the device area 203. Note that, in later steps, the pads 101, 102, 103 will serve as pads used in a probe test and also as bonding pads for supplying power and signal.

Subsequently, the plurality of test areas 301 are tested by the same probe card via the plurality of pads 101, 102, 103, respectively. It will be described more specifically below. A feature of the first embodiment lies in that, as shown in FIG. 7, one chip (the chip area 202) is sectioned into four areas and the arrangement of pads in each test area 301 has a same layout so that the size of each test area 301 is similar to that of the normal LSI chips.

According to such a configuration as above, a probe card for testing each of the test area 301 has a size similar to that of probe cards used in tests on normal LSI chips, and thus an exclusive mother board and a probe card holder are not necessary to use. And, by making the arrangement of the pads 101, 102, 103 same in each test area 301, and probe cards which correspond to respective test areas are not necessary to use, thereby enabling probe tests on respective test areas 301 by the same probe card.

Figure 8:
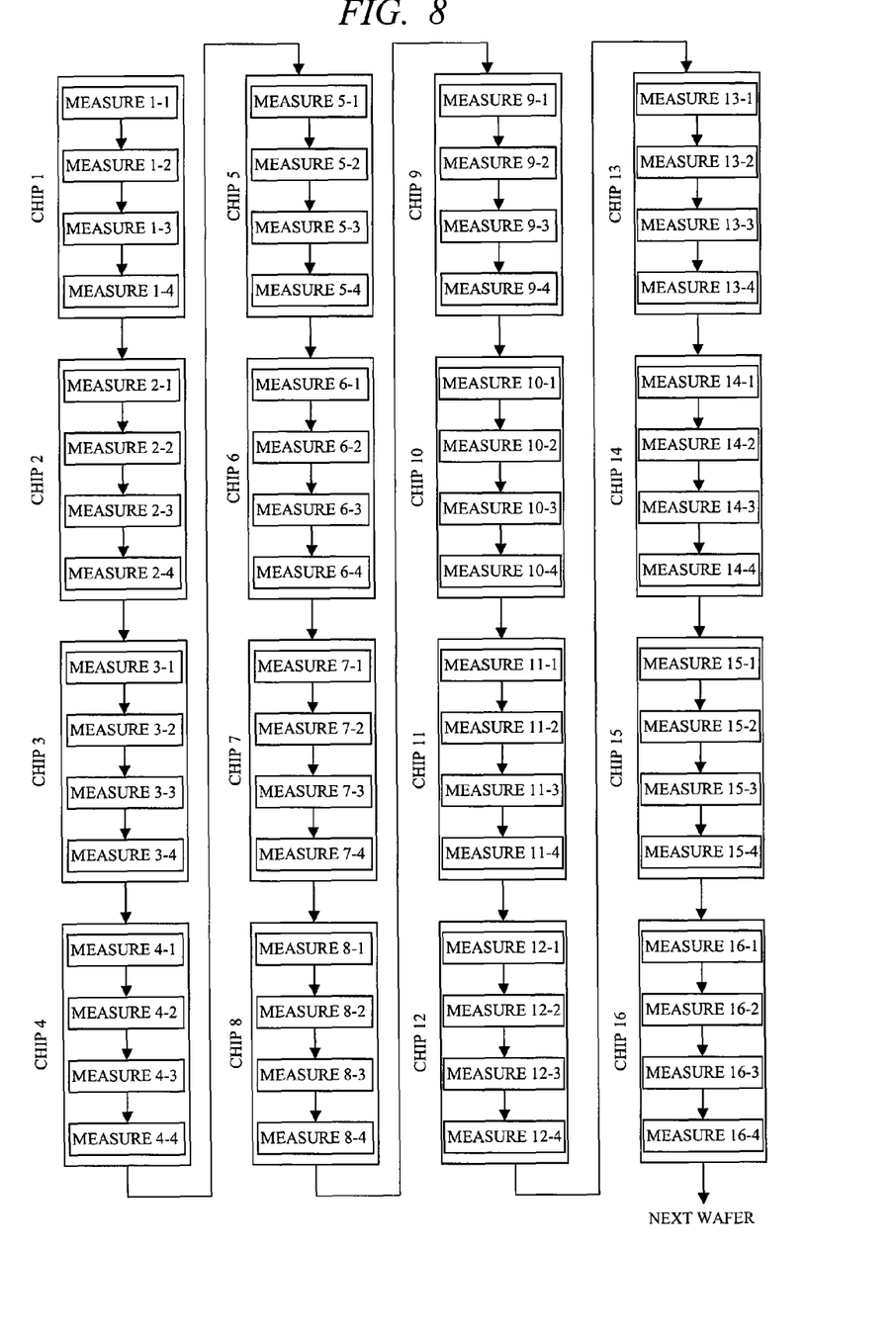
FIG. 8 is a flow chart of an example of a probe test according to the first embodiment.
Figure 9:
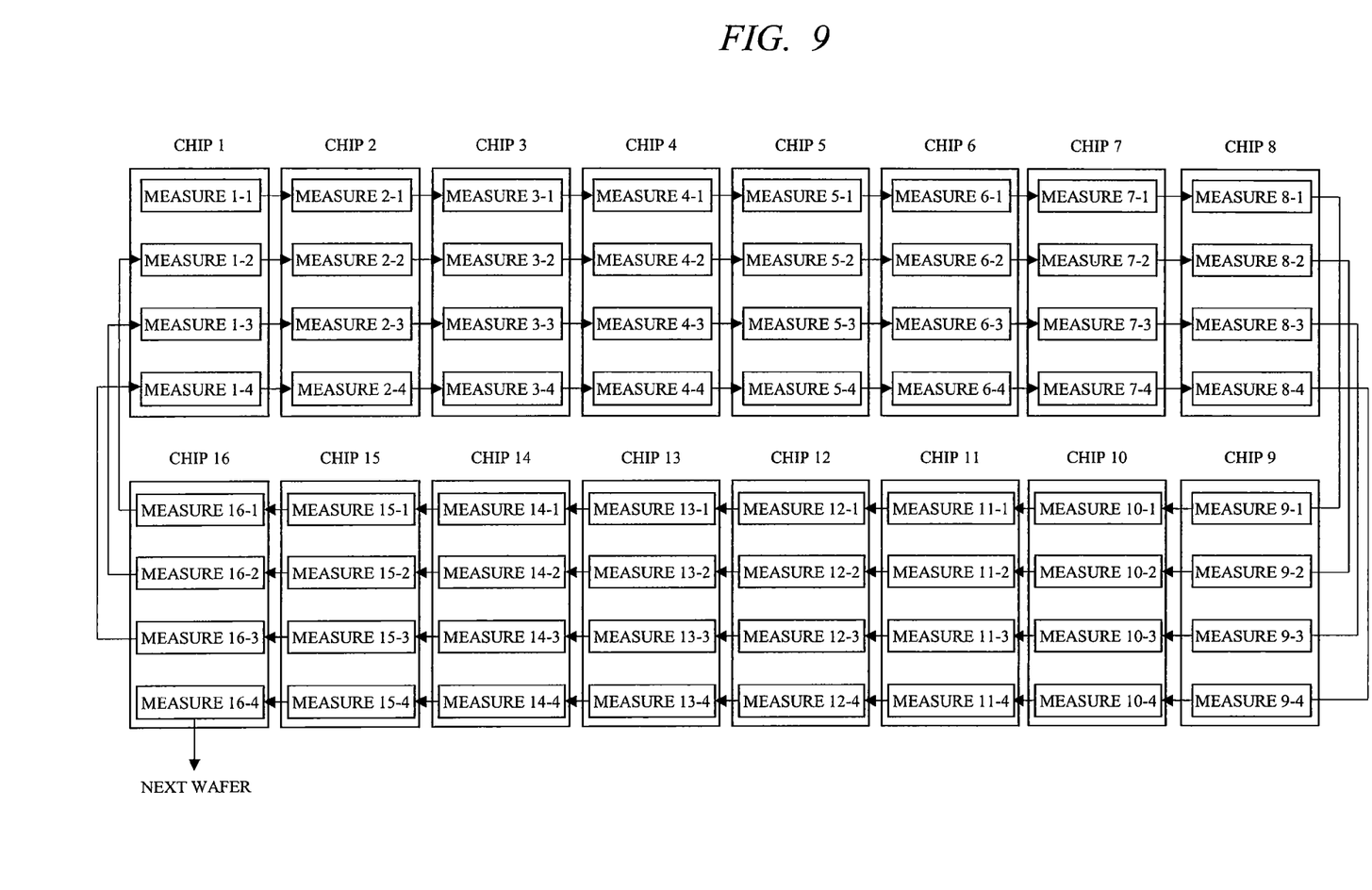
FIG. 9 is a flow chart of another example of a probe test according to the first embodiment.

The numerals shown in the chip area 202 in FIG. 1 are put for numbering areas to perform probe tests, and the first numeral denotes chip number and the second numeral denotes area number of each chip. A method of the probe test is performed by, as shown in FIG. 8, sequentially repeating movements along chip and movements between chips such that probe tests on respective areas 1-1, 1-2, 1-3, 1-4 of a chip 1 are performed by moving lengthwise to positions along the chip, and then, the chips are shifted, and probe tests on areas 2-1, 2-2, 2-3, 2-4 of a chip 2 are performed by moving along the chip 2, thereby performing probe tests on all the chips on the wafer. Alternatively, as shown in FIG. 9, probe tests may be performed per same area such that a probe test on the area 1-1 of the chip 1 is performed and then a probe test on the area 2-1 of the chip 2 is performed.

Subsequently, the wafer 201 (cf. FIG. 1) is diced to take out a plurality of chips 202 (cf. FIG. 7) from the plurality of chip areas 202. In this manner, the MEMS according to the first embodiment comprises a chip including the plurality of pads 101 and the plurality of pads 102 electrically connected to the MEMS device formed on the main surface of the substrate 1, and a main surface of the chip is sectioned by the plurality of test areas 301 having same size, and the plurality of pads 101 and the plurality of pads 102 are laid out at corresponding positions in the respective plurality of test areas 301. Further, the layout of the plurality of pads 101 and the plurality of pads 102 is same in the respective plurality of test areas 301 when the chip is moved lengthwise (the horizontal direction in FIG. 7).

For example, in the case of MEMS configuring a large sensor, the number of MEMS devices to be mounted is large, and the size of a chip (chip area 202) is large. The size of the chip 1 of the first embodiment is, for example, 1 cm×4 cm and 2 cm×8 cm.

Therefore, according to the first embodiment, a chip is sectioned into areas having a similar size as the normal LSI chips even when the chip has a larger area than that of the normal LSI chips. In this manner, a probe card having a size similar to that of the probe card used in probe tests on the normal LSI chips can be used, and thus the probe test does not require a mother board limited to large-area chips and a probe card holder, thereby improving throughput of the test and reducing test cost.

Further, the pad arrangement used in the probe test is same in each test area 301, thereby allowing performing of tests on every device in the chip by one probe card. Therefore, it is possible to reduce cost for fabricating a probe card and time required to exchange probe cards, and thus test cost can be further reduced.

In the first embodiment, as shown in FIG. 7, while the chip has been sectioned into four areas, it is sufficient as long as the size of the sectioned area is similar to that of the normal LSI chips, and it is thus obvious that the number of sections may be two, three, four, or more. For example, when the chip shape is rectangular, the present invention is effective when a length of the one side of the chip is equal to or larger than 3 cm.

Moreover, also as to the flow of probe tests on chips in the wafer shown in FIG. 8 and FIG. 9, it is obvious that the tests are performed so as to make the test time minimum by the arrangement of chips and the number of sections on the wafer.

Second Embodiment

Figure 10:
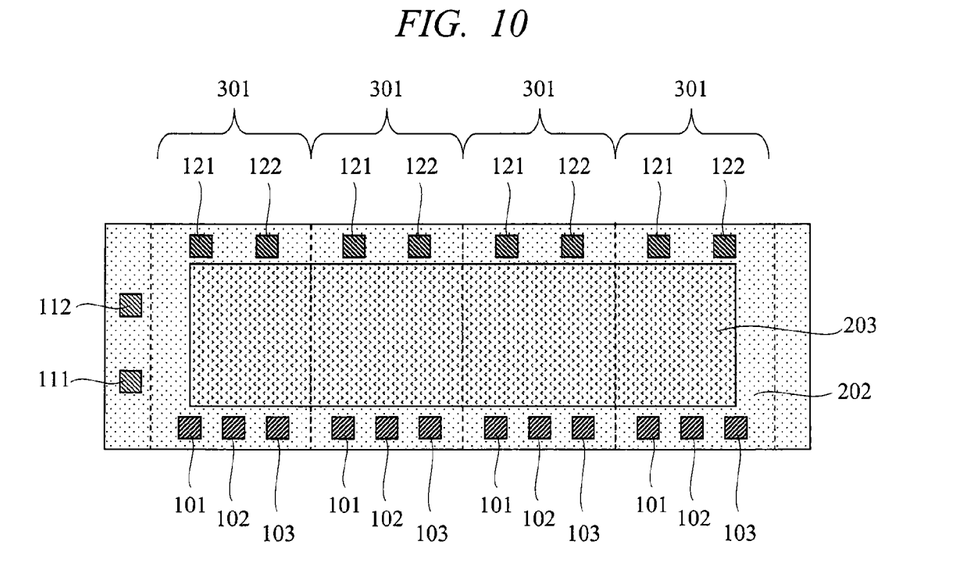
FIG. 10 is a plan view of a chip schematically showing MEMS according to a second embodiment of the present invention.
Figure 11:
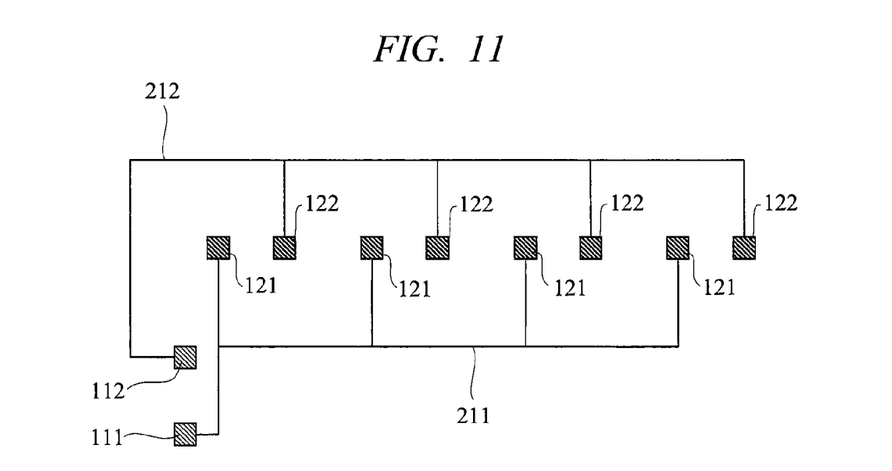
FIG. 11 is an illustrative diagram showing a connection of pads of FIG. 10.

FIG. 10 is a plan view of a chip schematically showing MEMS according to a second embodiment of the present invention, and FIG. 11 is a diagram for describing connections of pads of FIG. 10. The pads 101, 102, 103 are bonding pads for supplying power and signals to each device of the device area 203 from outside, and also pads to use in probe tests. The test area 301 shows areas made by sectioning the chip 202, in which four areas are sectioned. It means that, a probe test on the chip 202 is performed based on the sectioning of the chip into four areas. Pads 111, 112 are bonding pads used only for supplying power and signals to each device from the outside, and pads 121, 122 are pads to use only in probe tests. As shown in FIG. 6, the bonding pad 111 is connected to the probe-test pad 121 in each test area 301 by a wiring 211 on the chip. Similarly, the bonding pad 112 is connected to the probe-test pad 122 in each of the test area 301 by a routed wiring 212.

A feature of the second embodiment lies in that, as shown in FIG. 10 and FIG. 11, the chip 202 is sectioned into four areas so that the size of each test area 301 is similar to that of the normal LSI chips; the bonding pads 111, 112 are routed by the wiring; the probe-test pads 121, 122 are provided in each group; and further the layout of pads is the same in each test area 301.

As to forming the pads 101 to 103, 111, 112, 121, 122, they are formed at the same time and laid out at corresponding positions in respective test areas 301, and the pads 111, 112 are laid out outside the test areas 301.

According to such a configuration, even when the bonding pads necessary for probe tests are not present in each sectioned test area 301, the probe test in each test area 301 is possible.

And, similarly to the first embodiment described above, the size of a probe card for a probe test on each test area 301 is similar to that of the probe card used in tests on the normal LSI chips, and thus an exclusive motherboard and a probe holder are not necessary to use.

Further, the arrangement of the pads 101, 102, 103, 121, 122 is same in each test area 301, and thus probe cards corresponding to respective test areas 301 are not necessary to use, thereby enabling probe tests on respective test areas by using a same probe card.

A method of the probe test of the second embodiment is also similar to the first embodiment described above, and performed by sequentially repeating movements along chip and movements between chips such that probe tests on respective test areas 301 of a chip are performed by moving lengthwise of the chip, and then the chip is moved, and the probe tests are similarly performed on respective test areas 301 of the next chip, thereby performing probe tests on all of the chips on the wafer. Alternatively, probe tests may be performed per same test area 301 such that a measurement on one test area 301 in a chip is performed, and next, a same test area 301 in the next chip is measured.

After the probe tests, the pads 101 to 103, 111, 112 are wire-bonded. On the other hand, since the pads 121, 122 are arranged in the pad arrangement of each test area 301 for probe tests, they are not wire-bonded.

As described in the foregoing, according to the second embodiment, also in the case where the chip has larger area than that of the normal LSI chips and bonding pads required to probe tests are not provided to the sectioned areas, the chip is sectioned into areas having a similar size as the normal LSI chips and the bonding pads required for probe tests and pads to use in probe tests provided to each area are connected by wirings, thereby enabling probe tests on respective sectioned areas. Therefore, a probe card having a similar size as the probe cards used in probe tests on the normal LSI chips can be used. And the probe test does not need a mother board limited to large-area chips and a probe card holder, thereby improving throughput of tests and reducing test cost. Further, since the arrangement of probe-test pads is made same in each area, all the devices in the chip can be tested by one probe card, thereby reducing cost for fabricating the probe card and time required to exchange the cards and thus further reducing test cost.

The routed wirings 211, 212 connecting the pads 111, 112 and 121, 122, and the pads 121, 122 provided for probe tests may be left in the chip as they are, after the probe tests are finished. If there occurs a problem in device characteristics such as a parasitic capacitance when they are left, the pads and wirings are removed by etching after finishing the probe tests. Alternatively, the wirings may be cut by laser. By cutting the electrical connections between the pads 121, 122 and the pads 111, 112 electrically connected to each other near the pads 111, 112, the parasitic capacitance can be further suppressed.

While the chip 202 in FIG. 10 is sectioned into four areas, it is sufficient as long as the size of the area is similar to that of the normal LSI chip, and thus the number of sections can be two, three, four or more.

Third Embodiment

Figure 12:
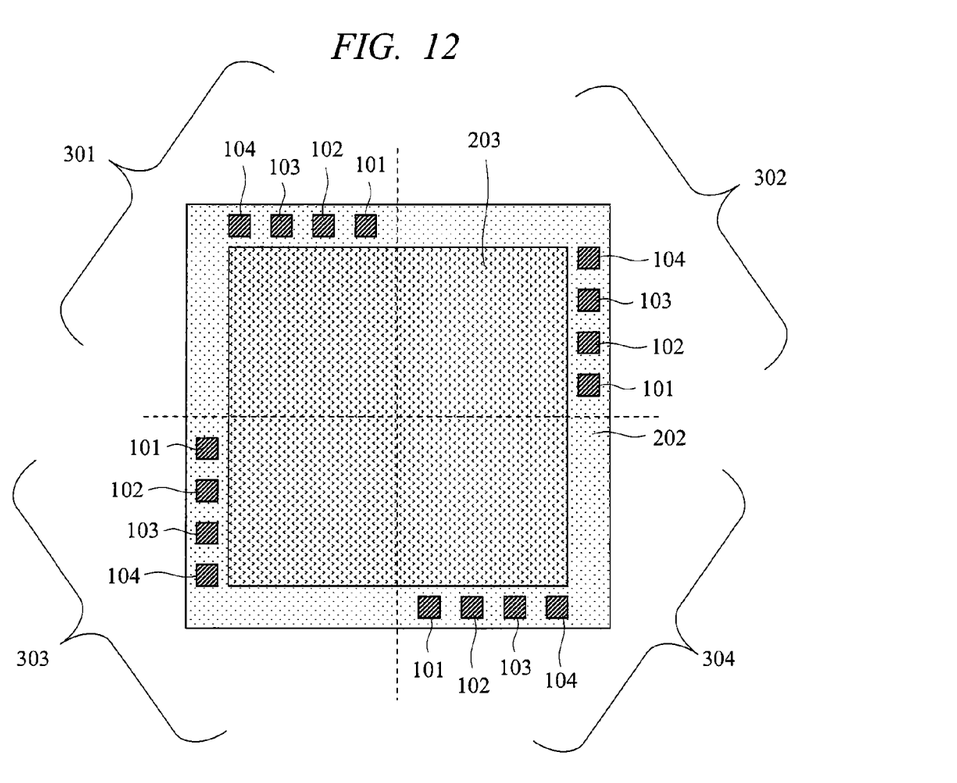
FIG. 12 is a plan view of a chip schematically showing the MEMS according to a third embodiment of the present invention.

FIG. 12 is a plan view of a chip schematically showing MEMS according to a third embodiment of the present invention. 202 denotes the chip, and 203 denotes the device area to which a sensor and an actuator are formed. 101, 102, 103, 104 serve as bonding pads for supplying power and signals to each device of the device area 203 from the outside, and as pads to be used in probe tests at the same time. 301, 302, 303, 304 denote test areas made by sectioning the chip 202, and the chip 202 is sectioned into four areas. That is, the probe tests on the chip 202 are performed based on the sectioning into four areas.

A feature of the third embodiment lies in that, as shown in FIG. 12, the chip 202 is sectioned into four areas so that sizes of the test areas 301, 302, 303, 304 are similar to that of the normal LSI chips as the chips are rotated by 90° or 180°, thereby making a layout such that the pad arrangement in each area is the same.

According to such a configuration, the size of the probe card for probe test on each area is similar to that of the probe card used in probe tests on normal LSI chips, and thus an exclusive mother board and a probe card holder are not necessary to use. Further, the pads 101, 102, 103, 104 in the test areas 301, 302, 303, 304 are laid out so that the arrangement remains the same upon rotating the chip by 90° or 180°, and thus probe cards corresponding to respective test areas are not necessary to use, thereby enabling probe tests on respective areas by the same probe card.

Figure 13:
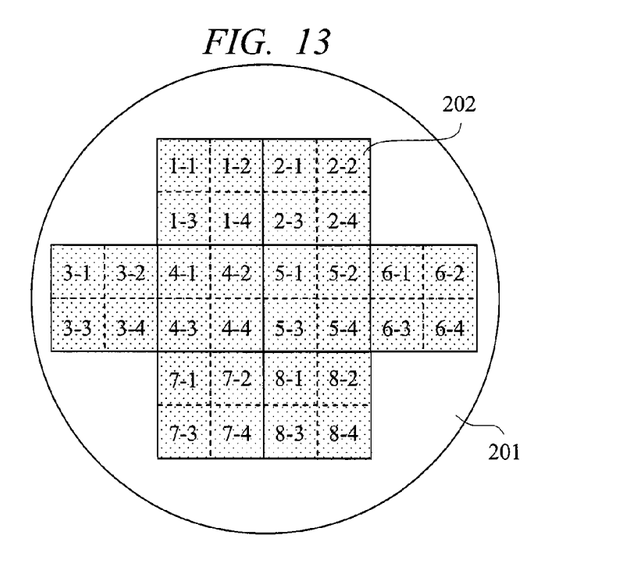
FIG. 13 is a plan view of a wafer schematically showing MEMS according to the third embodiment of the present invention.

FIG. 13 shows a Si wafer to which eight of the chips 202 shown in FIG. 12 are formed. 201 in FIG. 13 denotes the Si wafer. The numerals shown in the chip 202 are put for numbering areas to perform probe tests, the first numeral denotes a chip number and the second numeral denotes an area number in the chip.

Figure 14:
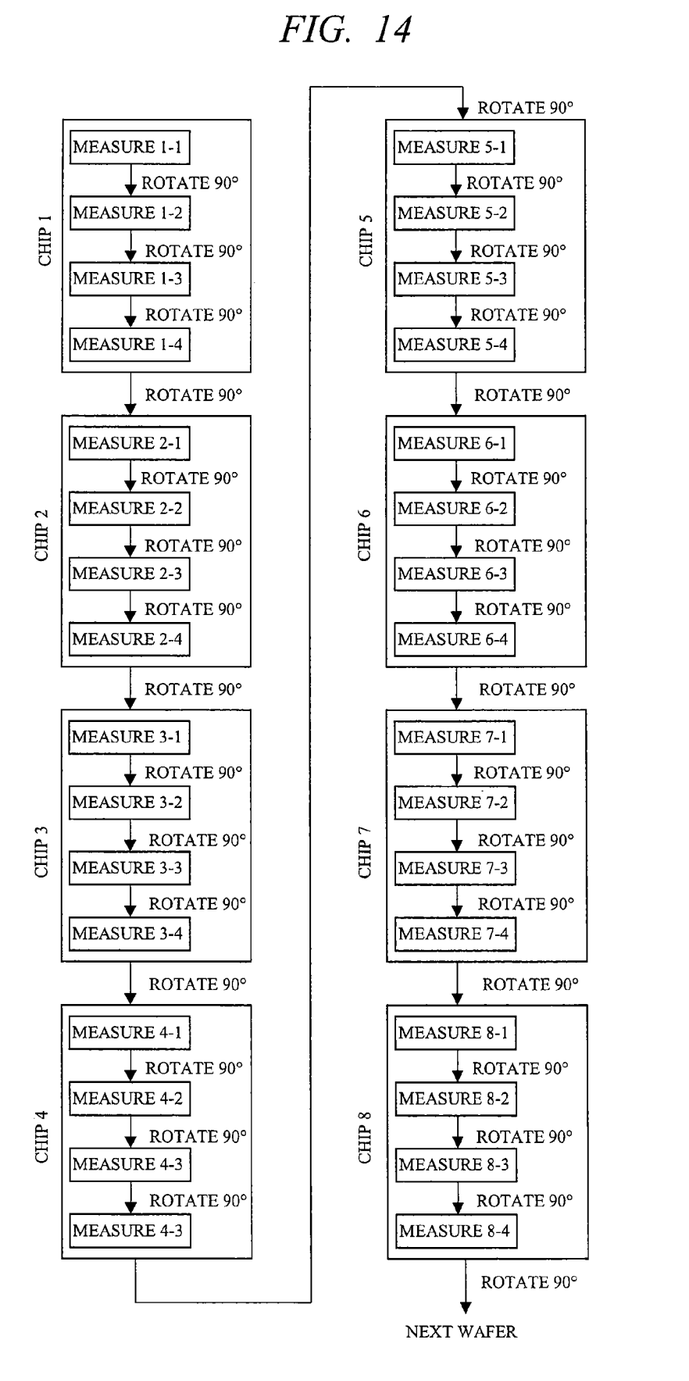
FIG. 14 is a flow chart showing an example of a probe test according to the third embodiment.

A method of a probe test on the chips arranged as shown in FIG. 13 is shown in FIG. 14. First, a probe test on 1-1 of a chip 1 (corresponding to 301 in FIG. 12) is performed, and next, the Si wafer 201 is rotated by 90° and a probe test on 1-2 (corresponding to 302 in FIG. 12) is performed. Next, the Si wafer 201 is further rotated by 90°, and a probe test on 1-4 (corresponding to 304 in FIG. 12) is performed. Subsequently, the Si wafer 201 is further rotated by 90°, and a probe test on 1-3 (corresponding to 303 in FIG. 12) is performed, thereby performing probe tests on all of the devices of the chip 1. By repeating similar steps also in the chip 2 and the subsequent chips by moving the chip, probe tests on all of the chips on the wafer can be performed.

Figure 15:
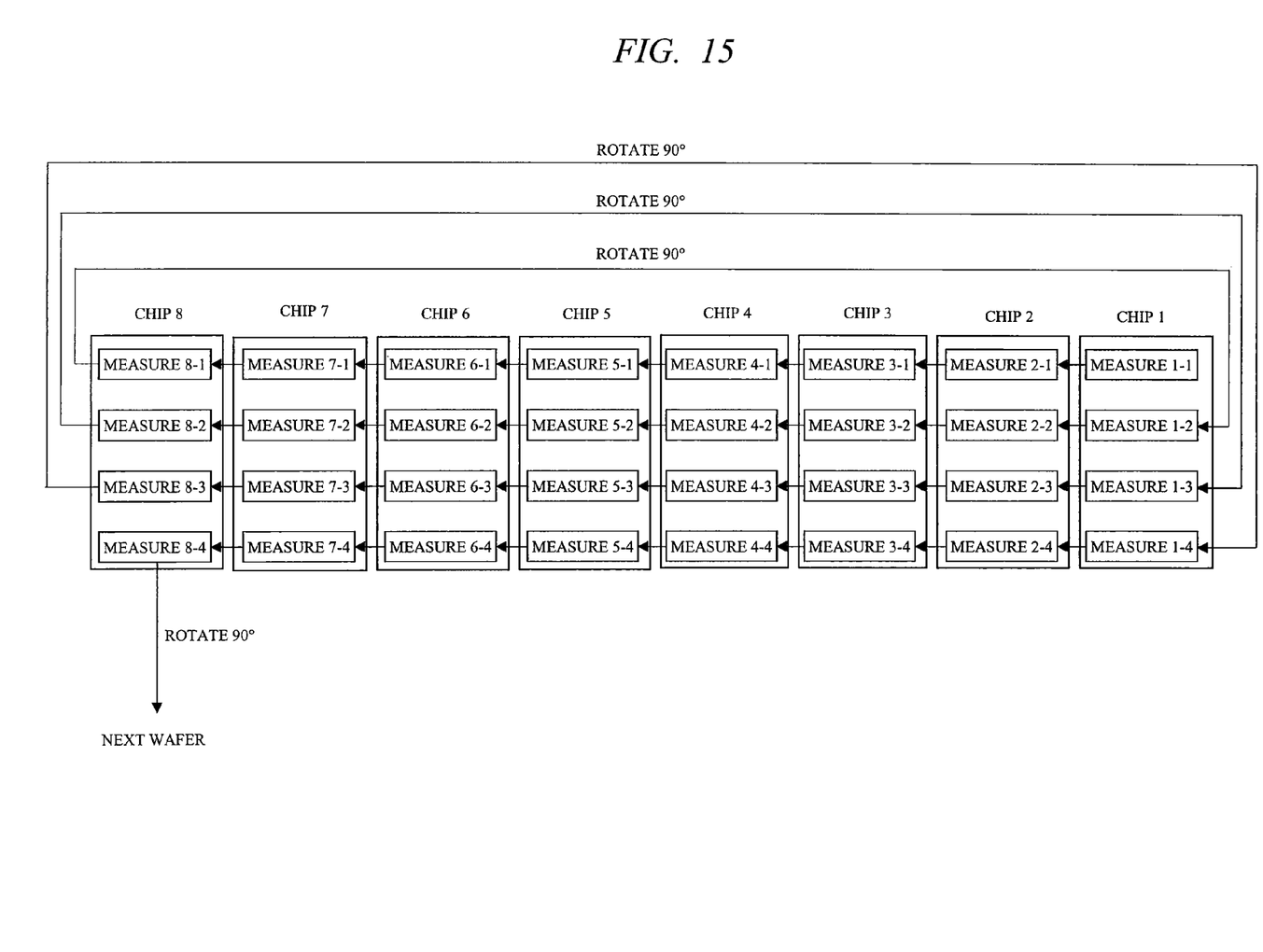
FIG. 15 is a flow chart showing another example of a probe test according to the third embodiment.

And, to reduce the number of rotations of the wafer, as shown in FIG. 15, a measurement on the first area of each chip is performed all through the chips, and subsequently a measurement on the second area of each chip is performed all through the chips. In this manner, same areas in respective chips are measured all through the chips, and the Si wafer is rotated subsequently, and then the other areas may be measured.

As described above, according to the third embodiment, the chip is sectioned into areas having a similar size as the normal LSI chips even when the chip has a larger area than that of the normal LSI chips. Therefore, a probe card having a similar size as the probe cards used in probe tests on the normal LSI chips can be used, and thus a mother board limited to large-area chips and a probe card holder are not necessary for probe tests, thereby improving throughput of tests and reducing test cost.

Further, the pad arrangement to be used in probe tests is laid out such that each test area is same as rotating the wafer, thereby allowing probe tests on all of the devices in the chips by one probe card. Moreover, fabricating cost of probe cards and time required to exchange cards are can be cut, thereby further reducing test cost.

While the chip shown in FIG. 12 is sectioned into four test areas, it is sufficient as long as the size of the sectioned area is similar to that of the normal LSI chips. It is obvious that the number of sections can be two, three, four or more.

In addition, as to the flow of probe tests on chips on the wafer shown in FIG. 14 and FIG. 15, it is also obvious that the flow may be performed so as to make the test time shortest by the arrangement and the number of sections of the chips on the wafer.

Fourth Embodiment

Figure 16:
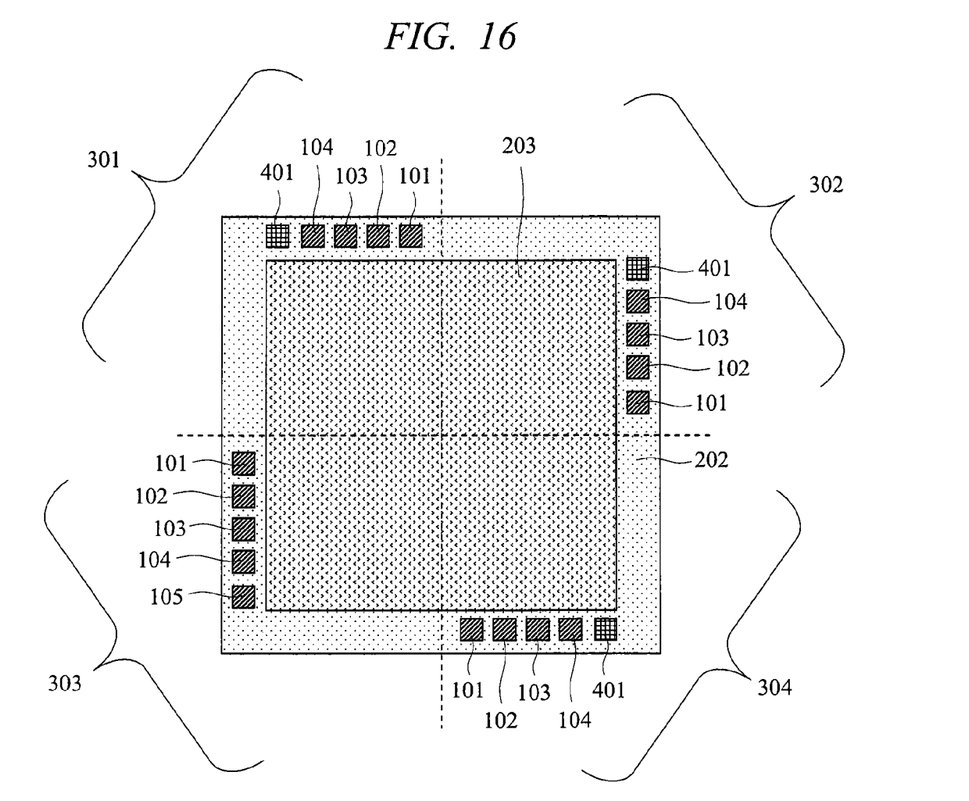
FIG. 16 is a plan view schematically showing MEMS according to a fourth embodiment of the present invention.

FIG. 16 is a plan view of a chip schematically showing MEMS according to a fourth embodiment of the present invention. 202 denotes the chip, and 203 denotes the device area to which a sensor and an actuator are formed. Pads 101, 102, 103, 104, 105 serve as bonding pads for supplying power and signals to each device of the device area 203 from the external, and as pads to be used in probe tests at the same time. The test areas 301, 302, 303, 304 denote test areas made by sectioning the chip 202, and four areas are sectioned. It means that, probe tests on the chip are performed individually for the four areas. 401 denotes a dummy pad provided for making the pad arrangement in each area the same.

The dummy pad 401 is formed at the same time with the pads 101 to 105. The pads 101 to 105 and the dummy pad 401 are laid out to corresponding positions in the plurality of test areas. The pads 101 to 105 are electrically connected to the MEMS device, and the dummy pad 401 is not electrically connected to the MEMS device.

A feature of the fourth embodiment lies in that, as shown in FIG. 16, the chip 202 is sectioned into four test areas so that the sizes of the test areas 301, 302, 303, 304 are similar to that of the normal LSI chips, and the dummy pad 401 is provided for making the pad arrangements the same in each test area even in the case where the numbers of pads in respective sectioned test areas are different. And, according to such a configuration, the probe card for the probe test on each test area has a similar size as the normal LSI chips, and thus an exclusive mother board and a probe card holder are not necessary to use.

As described above, according to the fourth embodiment, even when the chip has a larger area than that of the normal LSI chips, the chip is sectioned into areas having a similar size as the normal LSI chips. Therefore, since a probe card having a similar size as the probe cards used in probe tests on the normal LSI chips can be used, and a mother board limited to large-area chips and a probe card holder are not necessary in probe tests, thereby improving throughput of tests and reducing test cost. And, the layout of the pads 101, 102, 103, 104, 105 in the test area 301 and the layout of the pads 101, 102, 103, 104, 401 in the test areas 302, 303, 304 are same when rotating the chip by 90° and 180°, and thus probe cards corresponding to respective areas are not necessary to use, thereby enabling probe tests on respective areas by using a same probe card.

While the chip shown in FIG. 16 is sectioned into four test areas, it is sufficient as long as the size of the sectioned test area is similar to that of the normal LSI chips. It is obvious that the number of sections can be two, three, four, or more.

Further, the number and position of the dummy pad are sufficient as long as the arrangements of probe-test pads arranged in respective sectioned test areas are the same. The number of dummy pads can be two or more.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, while the cases where a silicon substrate is used for the substrate has been described in the above embodiments, the present invention is applicable to a semiconductor substrate such as a gallium arsenide substrate, an insulating substrate, and a glass substrate.

The pad layout and the test method for a probe test according to the present invention are widely applicable to manufacturing fields of manufacturing semiconductor chips mounting a sensor and an actuator.

What is claimed is:

1. A semiconductor device comprising:
   a wafer having a plurality of chips, each chip having a plurality of test areas in plan view, the test areas of the chips being of same size and shape, and the test areas to be individually probe tested using a common set of test probes,
   each test area having a plurality of probe contact pads including a first pad and a second pad which are electrically connected to a device formed on a main surface of a substrate, and
   the plurality of probe contact pads being laid out at same positions in each test area such that with repeating predetermined movement of the wafer, the respective pluralities of probe contact pads of different test areas can be successively brought into coincidence with a plurality of predetermined test probe contact positions for contact with the common set of test probes,
   wherein the device formed on the main surface of the substrate comprises:
   a first electrode provided on the substrate;
   a hollow portion provided on the first electrode; and
   a second electrode provided on the hollow portion,
   wherein the first electrode is electrically connected to the first pad of the plurality of probe contact pads of a corresponding test area, and
   wherein the second electrode is electrically connected to the second pad of the plurality of probe contact pads of said corresponding test area.

2. The semiconductor device according to claim 1, wherein the predetermined movement includes movement in a lengthwise direction of a side a chip.

3. The semiconductor device according to claim 2, wherein the chips are rectangular and the predetermined movement includes movement along shorter sides of adjacent chips for successive probe testing of corresponding test areas of the adjacent chips.

4. The semiconductor device according to claim 2, wherein the chips are rectangular and the predetermined movement includes movement along a longer side of a chip for successive probe testing of adjacent test areas of the chip.

5. The semiconductor device according to claim 1, wherein the predetermined movement includes a rotational movement about a rotation axis perpendicular to a main surface of the wafer.

6. The semiconductor device according to claim 5, wherein the rotational movement is by 90° or 180° about the rotation axis.

7. The semiconductor device according to claim 1, wherein the number of test areas of each chip is at least three.

8. The semiconductor device according to claim 1, wherein each chip further has a third pad electrically connected to the first pads of the plurality of test areas of the chip, wherein the third pad is laid out outside the plurality of test areas of the chip, wherein the first pad is not to be wire-bonded, and wherein the second pad and the third pad are to be wire-bonded.

9. The semiconductor device according to claim 1, wherein each test area has a dummy pad not electrically connected to the device, and wherein the dummy pads are laid out at same positions in the respective test areas.

10. The semiconductor device according to claim 1, wherein the chip has a rectangular shape and a length of one side is equal to or larger than 3 cm.

* * * * *